US007902727B1

(12) United States Patent
Sham et al.

(10) Patent No.: US 7,902,727 B1
(45) Date of Patent: Mar. 8, 2011

(54) APPARATUS AND METHOD FOR GENERATING ELECTRICITY USING PIEZOELECTRIC MATERIAL

(75) Inventors: Man-Lung Sham, Shatin (HK); Ziyang Gao, Park Island (HK); Tung Ching Lui, Tuen Mun (HK); Chang Hwa Chung, Shatin (HK)

(73) Assignee: Hong Kong Applied Science and Technology Research Institute Co. Ltd., Shatin (HK)

( * ) Notice: Subject to any disclaimer, the term of this patent is extended or adjusted under 35 U.S.C. 154(b) by 0 days.

(21) Appl. No.: 12/539,315

(22) Filed: Aug. 11, 2009

(51) Int. Cl.
*H01L 41/08* (2006.01)
(52) U.S. Cl. .................. 310/339; 310/328; 310/340
(58) Field of Classification Search .................. 310/328, 310/329, 339
See application file for complete search history.

(56) References Cited

U.S. PATENT DOCUMENTS

| | | | | |
|---|---|---|---|---|
| 3,940,637 | A * | 2/1976 | Ohigashi et al. | 310/339 |
| 4,580,074 | A * | 4/1986 | Gilman | 310/339 |
| 4,581,506 | A * | 4/1986 | Bai et al. | 200/61.45 R |
| 5,155,408 | A * | 10/1992 | Takeuchi | 310/339 |
| 5,500,635 | A | 3/1996 | Mott | |
| 5,918,502 | A | 7/1999 | Bishop | |
| 6,392,329 | B1 * | 5/2002 | Bryant et al. | 310/328 |
| 6,407,484 | B1 * | 6/2002 | Oliver et al. | 310/339 |
| 6,433,465 | B1 * | 8/2002 | McKnight et al. | 310/339 |
| 6,630,894 | B1 | 10/2003 | Boyd et al. | |
| 6,664,712 | B2 * | 12/2003 | Rayner et al. | 310/323.02 |
| 6,861,785 | B2 | 3/2005 | Andre et al. | |
| 6,994,762 | B2 | 2/2006 | Clingman et al. | |
| 7,095,529 | B2 | 8/2006 | Face et al. | |
| 7,161,276 | B2 | 1/2007 | Face | |
| 7,436,104 | B2 | 10/2008 | Clingman et al. | |
| 7,439,657 | B2 * | 10/2008 | Clingman et al. | 310/339 |
| 7,446,459 | B2 | 11/2008 | Xu et al. | |
| 7,692,366 | B2 * | 4/2010 | Thiesen | 310/339 |

FOREIGN PATENT DOCUMENTS

| | | |
|---|---|---|
| CN | 1901252 A | 1/2007 |
| CN | 101278768 A | 10/2008 |
| CN | 201210651 Y | 3/2009 |
| WO | WO 2008/069524 A1 | 6/2008 |

OTHER PUBLICATIONS

International Search Report for corresponding PCT/CN2009/073396, completed May 5, 2010, by Yujie Ma of the State Intellectual Property Office, the P.R. China.

* cited by examiner

*Primary Examiner* — Mark Budd

(57) ABSTRACT

An apparatus and method for generating electricity using piezoelectric material. The apparatus comprises a first elongate member and a second elongate member that are joining together at first and second points which are spaced apart from each other. The second elongate member comprises a piezoelectric element, or has a piezoelectric element mounted thereon. When pressure is applied to the first elongate member, the second elongate member is stretched and the stretching force is applied to the piezoelectric element. This generates electricity. A similar arrangement with a third elongate member may be provided on the other side of the second elongate member. The apparatus may be placed in a shoe or underneath a floor, so that the variation in pressure caused by walking may be used in generate electricity.

21 Claims, 9 Drawing Sheets

A. Dual modes

B. Stretching mode

C. Compression mode

B. Stretching mode
D. Compression mode

A. Dual modes
C. Compression mode

APPARATUS AND METHOD FOR GENERATING ELECTRICITY USING PIEZOELECTRIC MATERIAL

FIELD OF THE INVENTION

The present invention relates to an apparatus and method for generating electricity using piezoelectric material. It relates in particular, but not exclusively, to an apparatus that is powered by movement of a human body part, e.g. a foot.

It may, for example, be used in the sole of a shoe or under a floor. Then the changes in pressure, caused by a person walking or moving, deform the piezoelectric material causing it to generate electricity.

BACKGROUND

U.S. Pat. No. 5,918,502 discloses an article of footwear which has a piezoelectric element in the sole. The piezoelectric element is pre-formed in an arcuate shape. When the wearer of the footwear walks or runs the force of the sole impacting the ground causes the piezoelectric element to deform. This generates electricity. However, it requires a special type of curved piezoelectric element, which is expensive and difficult to manufacture.

SUMMARY OF THE INVENTION

The present invention aims to provide an alternative structure for generating electricity from a piezoelectric element. In preferred embodiments the structure may generate more electricity and/or be more robust than prior art designs. Furthermore, some preferred embodiments use one or more simple, non-curved piezoelectric elements; this may lead to cost savings and improved ease of manufacture.

A first aspect of the invention provides an apparatus for generating electricity comprising a first elongate member and a second elongate member, the first and second elongate members being joined together at first and second points which are spaced apart from each other, the second elongate member comprising a piezoelectric element or having a piezoelectric element mounted thereon; whereby when pressure is applied to the first elongate member, the second elongate member is stretched and a stretching force is applied to the piezoelectric element. As the piezoelectric element is stretched this generates electricity.

The joins between the first and second elongate members may be by adhesive or any other suitable method. There may be an intermediate element joining the two members, but usually they will joined together directly. An important feature is that the joins cause a stretching force to be applied to the second elongate member when the ends (or other joining points) of the first elongate member are moved apart. For example if the first elongate member has a curved arcuate like portion which is compressed by pushing first elongate member towards the second elongate member, then it will lengthen and its ends will move outwards as it is compressed. This causes a stretching force to be applied to the second elongate member via the joins.

Preferably the apparatus is arranged for transmitting a compressive force to the piezoelectric element as well as a stretching force. The apparatus may be arranged to apply the stretching force and the compressive force simultaneously to the piezoelectric element once the first elongate member has been deformed by a predetermined amount. For example, once the first elongate member has been deformed such that it contacts the piezoelectric element or once the first elongate member has compressed a spacer between itself and the piezoelectric element by a given amount.

The first and second elongate members are joined together at the joining points. Between the joining points, the first and second members are preferably not in contact when in the rest state. Preferably there is a gap between the first and second members that may be partially or fully filled by one or more spacers.

Preferably at least one spacer is provided between the first elongate member and the piezoelectric element. The spacer may transmit a compressive force to the piezoelectric element when the first elongate member is pushed towards the second elongate member. The spacer may also limit the extent of deformation of the first elongate member. This helps to prevent the elongate member from fracturing.

Preferably the first elongate member is stiffer than the second elongate member. This improves the tendency of the apparatus to stretch the first elongate member in response to compression of the apparatus pushing the first and second elongate members together.

In a preferred structure, a third elongate member is provided on an opposite side of the second elongate member to the first elongate member; the third elongate member being joined to the second elongate member at third and fourth points which are spaced apart from each other. This enhances the ability of the apparatus to stretch the second elongate member. Generally the second elongate member has a first face facing the first elongate member and a second face facing the third elongate member. Preferably both the first and second faces are at least partially coated with piezoelectric material. This increases the amount of piezoelectric material (e.g. there may be two or more piezoelectric elements), thus increasing the amount of electricity produced.

Preferably the first elongate member is curved or non-linear. Preferably the third elongate member is curved or non-linear. Preferably the second elongate member is linear and non-curved.

Preferably the piezoelectric element (or elements) is not curved or pre-curved. Instead a simple off-the-shelf block of piezoelectric material (e.g. oblong in shape) or a simple coating may be used. This simplifies the manufacturing process compared to complex custom manufactured pre-curved piezoelectric elements.

Preferably the apparatus is designed for actuation by movement of a human or animal body. Most preferably the apparatus is designed for actuation by movement of a foot, usually a human foot. The apparatus may have a surface arranged for compression by a part of the human (or an animal) body.

A second aspect of the present invention provides a section floor having the electricity generating apparatus of the first aspect of the present invention beneath it. The electricity generating apparatus is actuatable to generate electricity by people running, walking or moving over the floor.

A third aspect of the present invention provides an article of footwear comprising the electricity generating apparatus of the first aspect of the present invention. Preferably the article of footwear comprises a ground contacting surface and a footbed surface, the electricity generating apparatus being provided between said ground contacting surface and said footbed surface.

A fourth aspect of the present invention provides an apparatus for generating electricity comprising first and second elongate members; wherein said second elongate member comprises one or more piezoelectric elements or has one or more piezoelectric elements mounted thereon; said apparatus being arranged such that when pressure is applied to push said second elongate member towards said first elongate member, said apparatus transmits a stretching force and a compressive force to said piezoelectric element. As both a stretching and compressive force are applied to the piezoelectric element more electricity may be produced than if only a stretching or only a compressive force was applied.

Preferably the apparatus is arranged to apply the stretching force and the compressive force simultaneously to the piezoelectric element. For example, a stretching force may be applied initially when the first elongate member is pushed towards the second elongate member, followed by a simultaneous stretching and compressive force when the first elongate member is pushed further towards the second elongate member. It is believed that simultaneous compression and stretching forces may produce more electricity than either force being applied individually.

A fifth aspect of the present invention provides an apparatus for generating electricity comprising first, second and third elongate members; wherein said first and third elongate members oppose each other and the second elongate member is provided in between said first and third elongate members; said apparatus being arranged such that when pressure is applied to push said first elongate member towards said third elongate member, the apparatus applies a stretching force to said second elongate member; said second elongate member comprising one or more piezoelectric elements or having one or more piezoelectric elements mounted thereon. This is a simple and convenient structure for producing electricity by deformation of piezoelectric elements when the apparatus is compressed (i.e. when the first elongate member is pushed towards the third elongate member and/or vice versa).

Preferably the apparatus is arranged to apply both compressive force and a stretching force to said one or more piezoelectric elements.

Preferably the apparatus comprises one or more spacers between said first elongate member and said piezoelectric element.

Preferably the first elongate member is joined to said second elongate member at first and second locations which are spaced apart from each other.

Preferably said third elongate member is joined to said second elongate member at third and fourth locations which are spaced apart from each other.

Preferably said second elongate member is less stiff than first and third elongate members. Preferably said first and third elongate members are curved.

A sixth aspect of the present invention provides a method of generating electricity comprising providing a structure comprising a first elongate member, and a second elongate member, the first and second elongate members being joined together at first and second points which are spaced apart from each other, the second elongate member comprising a piezoelectric element or having a piezoelectric element mounted thereon; and applying pressure to the first elongate member to push the first elongate member towards the second elongate member. The structure responds to said pressure by stretching the second elongate member and thus applying a stretching force to the piezoelectric element. As the piezoelectric element is stretched this generates electricity.

A seventh aspect of the present invention provides a method for generating electricity comprising providing a structure having first and second elongate members; wherein said second elongate member comprises a piezoelectric element or has a piezoelectric element mounted thereon; applying pressure to push said second elongate member towards said first elongate member, and transmitting a stretching force and a compressive force via said structure to said piezoelectric element. As both a stretching and compressive force are applied to the piezoelectric element, more electricity may be produced than if only a stretching or only a compressive force was applied.

An eighth aspect of the present invention provides a method for generating electricity comprising providing a structure first, second and third elongate members; wherein said first and third elongate members oppose each other and the second elongate member is provided in between said first and third elongate members; applying pressure to push said first elongate member towards said third elongate member and deforming said structure such that a stretching force is applied to said second elongate member; said second elongate member comprising one or more piezoelectric elements or having one or more piezoelectric elements mounted thereon.

Any of the features of any of the above aspects of the invention may be combined together.

BRIEF DESCRIPTION OF THE DRAWINGS

Preferred embodiments of the present invention will now be described, by way of example only, with reference to the drawings in which:—

DETAILED DESCRIPTION

Figure 1:
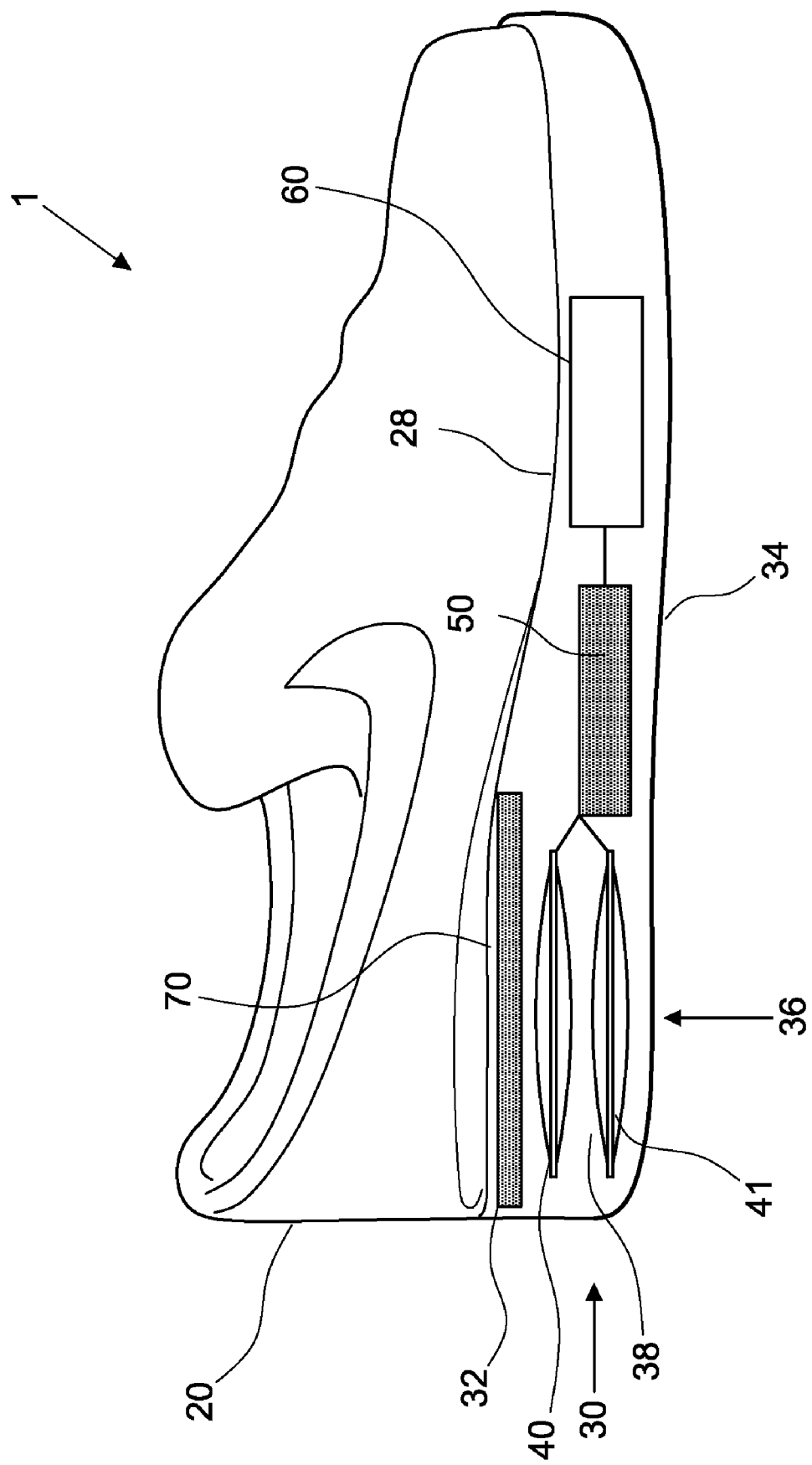
FIG. 1 shows an article of footwear containing an apparatus for generating electricity.

FIG. 1 shows an article of footwear 1 comprising an upper portion 28 adapted to surround a person's foot and a sole portion 30 adapted to underlie a person's foot and protect it from the ground. The sole has a foot bed surface 28 for contacting a person's foot and a bottom surface 34 for contacting the ground.

The sole 30 comprises a cavity in which are located a pair of piezoelectric apparatus for generating electricity 40, 41. In alternative embodiments the sole may have only one apparatus for generating electricity 40, or more than two such apparatus. The apparatus 40, 41 are preferably stacked, as shown in FIG. 1, one above the other. The apparatus 40, 41 are located in a portion of the sole just below the heel of the foot (when the footwear is being worn).

The footwear 1 has one or more electric devices 60 which are fully or partially powered by electricity generating apparatus 40, 41. In this embodiment the electricity generating apparatus 40, 41 are electrically connected to an energy storage module 50 for storing electricity. The energy storage module 50 may comprise one or more capacitors for storing electrical energy. The energy storage module 50 is electrically connected to one or more electric devices 60. In this embodiment the electric devices 60 comprise a sensor for sensing the number of steps taken by the person wearing the footwear, an MCU for processing data from the sensor and an RF module for communicating data from the MCU or the sensor. The footwear may also comprise a step counter display 70. The step counter display 70 may be powered by the energy storage module 50 or the electricity generating apparatus 40, 41. It receives data from the sensor 60.

Figure 2:
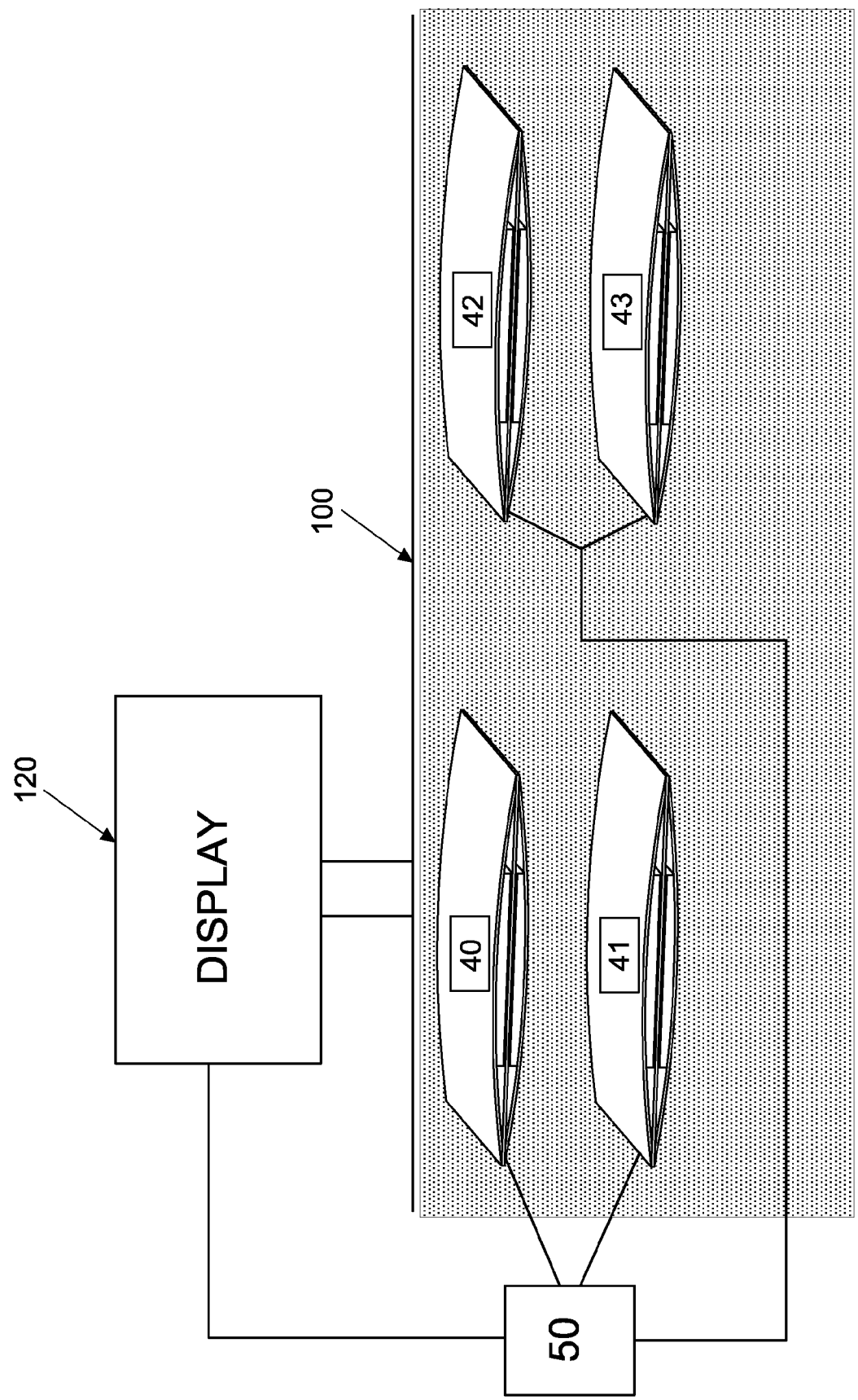
FIG. 2 shows a plurality of apparatus for generating electricity underneath a floor.

FIG. 2 shows an alternative embodiment of the invention in which a plurality of apparatus for generating electricity 40, 41, 42, 43 are located beneath a floor 100. The term floor is used very generally in this specification and includes any area, such as a platform, stage, floor boards, carpet etc, which people will walk on. The floor may comprise one or more members.

The floor 100 is deformable and capable of transmitting variations in pressure, caused by people walking or running over it, to the apparatus below. Beneath the floor are a plurality of apparatus 40, 41, 42, 43 for generating electricity. FIG. 2 shows only a section of the floor 100 and only four of the apparatus for generating electricity. It is anticipated that many more electricity generating apparatus may be used. Preferably, at least some of the electricity generating apparatus are stacked one on top of another as shown in FIG. 2. In alternative embodiments the arrangement of electricity generating apparatus may have only one level, or three or more levels in a stacked arrangement, rather than two levels as shown in FIG. 2.

The structure is such that pressure applied to the floor 100 is transmitted to the electricity generating apparatus 40, 41, 42, 43. Likewise, pressure applied to the electricity generating apparatus 40 on the first level is applied to any electricity generating apparatus 41 in lower levels of the stacked arrangement. This may, for example, be achieved by provision of a resilient material 110 between the floor 100 and the apparatus 40 and between the apparatus 40 and the lower level apparatus 41. Other arrangements for achieving transmission of pressure will be apparent to a person skilled in the art.

The electricity generating apparatus 40, 41, 42, 43 are electrically connected to an energy storage module 50. The energy storage module 50 is electrically connected to an electrically powered device, such as display 120. Alternatively, the electricity generating apparatus may be arranged to supply electricity to the device 120 directly. However, it is preferred that an energy storage module 50 is used in order to regulate the supply of power.

The arrangement of electricity generating apparatus under a floor will be especially useful in transport stations, tourist attractions and other areas which a large number of people pass through every day. In this way electrical power may be generated in an environmentally friendly fashion and electricity bills reduced.

Figure 3:
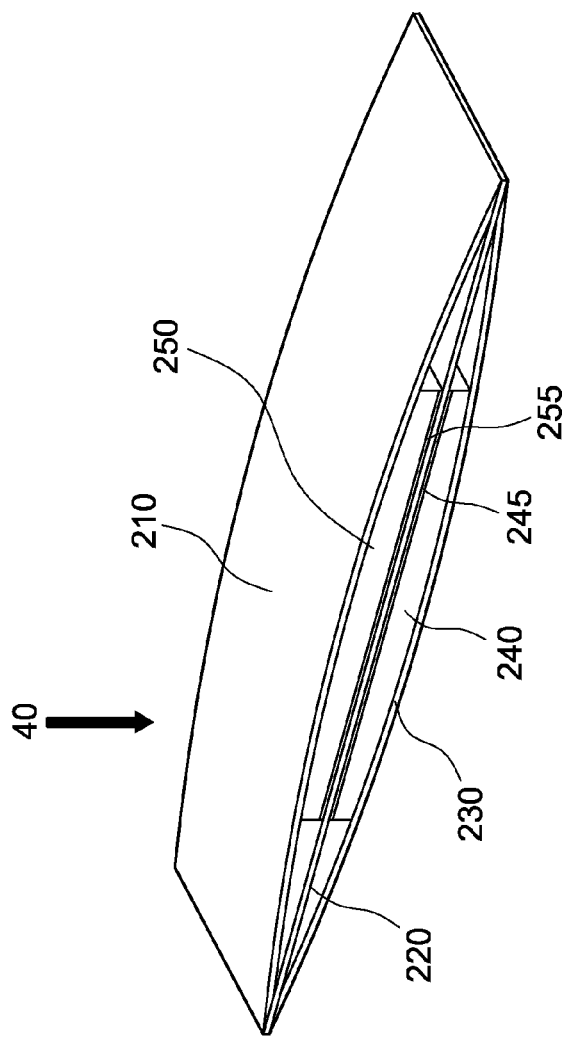
FIG. 3 illustrates an apparatus for generating electricity comprising piezoelectric material.
Figure 4:
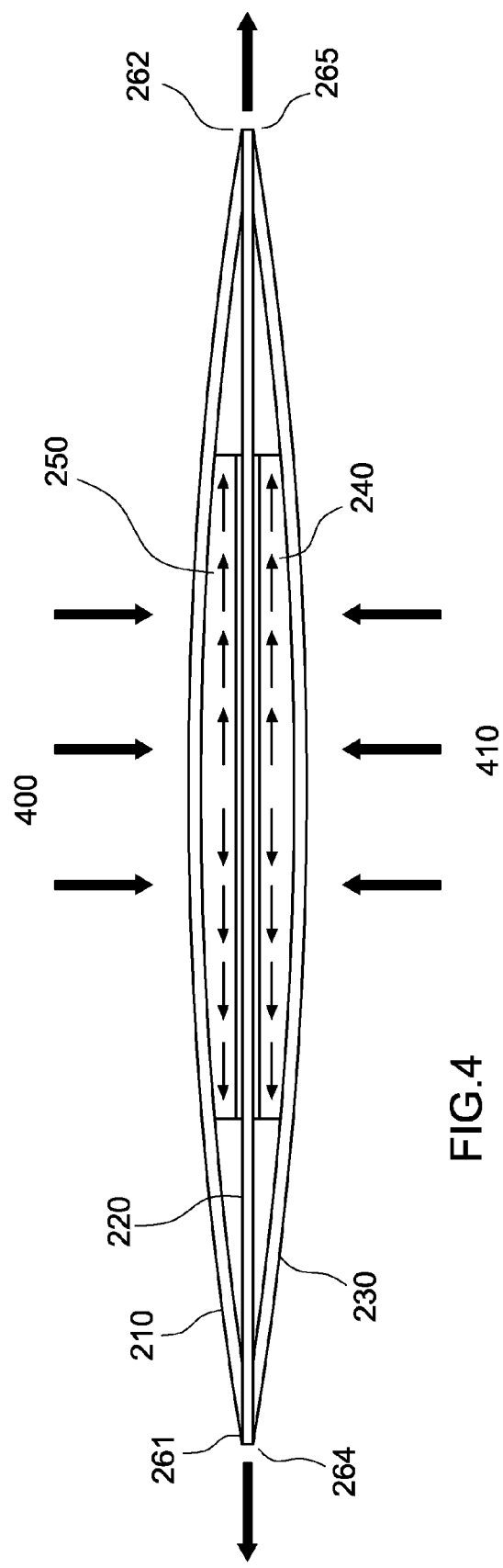
FIG. 4 illustrates how the apparatus of FIG. 3 applies a stretching force to the piezoelectric material.
Figure 5:
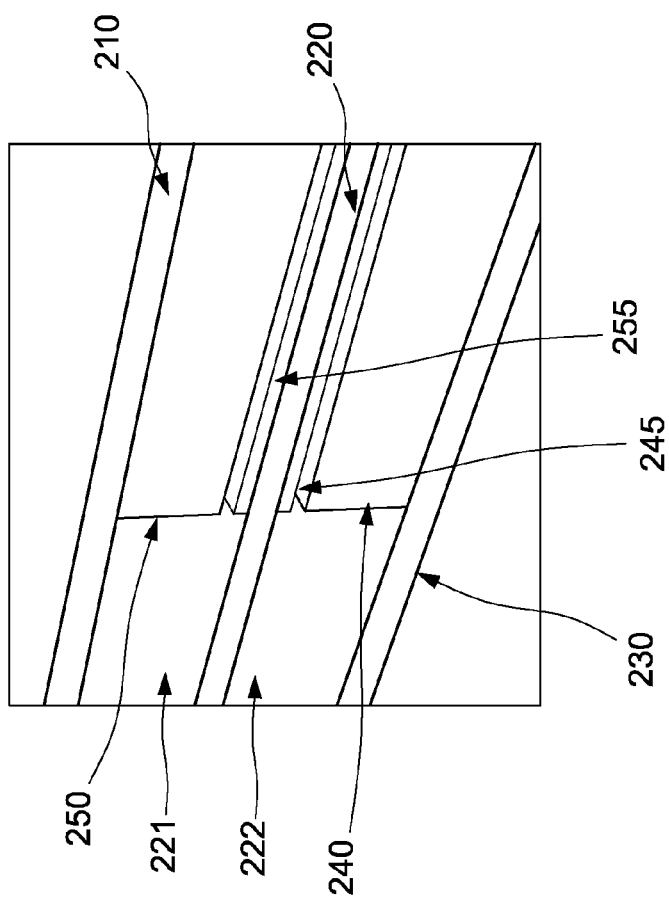
FIG. 5 shows a portion of the apparatus of FIG. 3 in more detail.

The design of the electricity generating apparatus is shown in more detail in FIGS. 3 to 5.

FIG. 3 shows an example of the apparatus for generating electricity 40. It comprises a first elongate member 210, a second elongate member 220 and a third elongate member 230. The first and third elongate members are non-linear and curved, while the second elongate member is not curved and is substantially linear. The second elongate member is sandwiched between the first two elongate members and joined to both of them at its ends. That is the second elongate member is joined with the first elongate member at points 261 and 262 and with the third elongate member at points 264 and 265.

One or more piezoelectric elements and spacers are provided between the second elongate member and the first and third elongate members. The arrangement is shown in more detail in FIG. 5.

A piezoelectric element 255 is mounted onto first surface 221 of the second elongate member 220, which faces an inner side of the first elongate member 210. The mounting may be by coating, adhesive or otherwise. A stopper or spacer 250 is provided between the first elongate member 210 and the piezoelectric element 255. The spacer 250 is arranged to transmit force and pressure from the first elongate member to the piezoelectric element 255. The spacer 250 also limits the extent of deformation of the first elongate member by limiting the amount by which it can move towards the second elongate member.

A second surface 222 of the second elongate member 220 faces an inner side of the third elongate member 230. A piezoelectric element 245 is mounted onto second surface 222. The mounting may be by coating, adhesive or otherwise. A stopper or spacer 240 is provided between the third elongate member 230 and the piezoelectric element 245. The spacer 240 is arranged to transmit force and pressure from the first elongate member 210 to the piezoelectric element 245. The spacer 240 also limits the extent of deformation of the third elongate member 230 by limiting the amount by which it can be pushed towards the second elongate member 220.

While the spacers 240, 250 are shown as separate elements, they could alternatively form an integral part of the elongate members.

The piezoelectric element is not pre-curved. In this embodiment it is a simple linear block. This has the advantage that off-the-shelf piezoelectric material may be used and there is no complicated manufacturing process. Furthermore, the piezoelectric element is relatively robust and may be less liable to fracture than a curved element.

In alternative embodiments the second elongate member may itself comprise a piezoelectric element. For example, the second elongate member may be made of piezoelectric material, or may be made primarily of another material, but include one or more piezoelectric elements. In that case, there is no need for a separate piezoelectric element to be mounted to the second elongate member.

Figure 11:
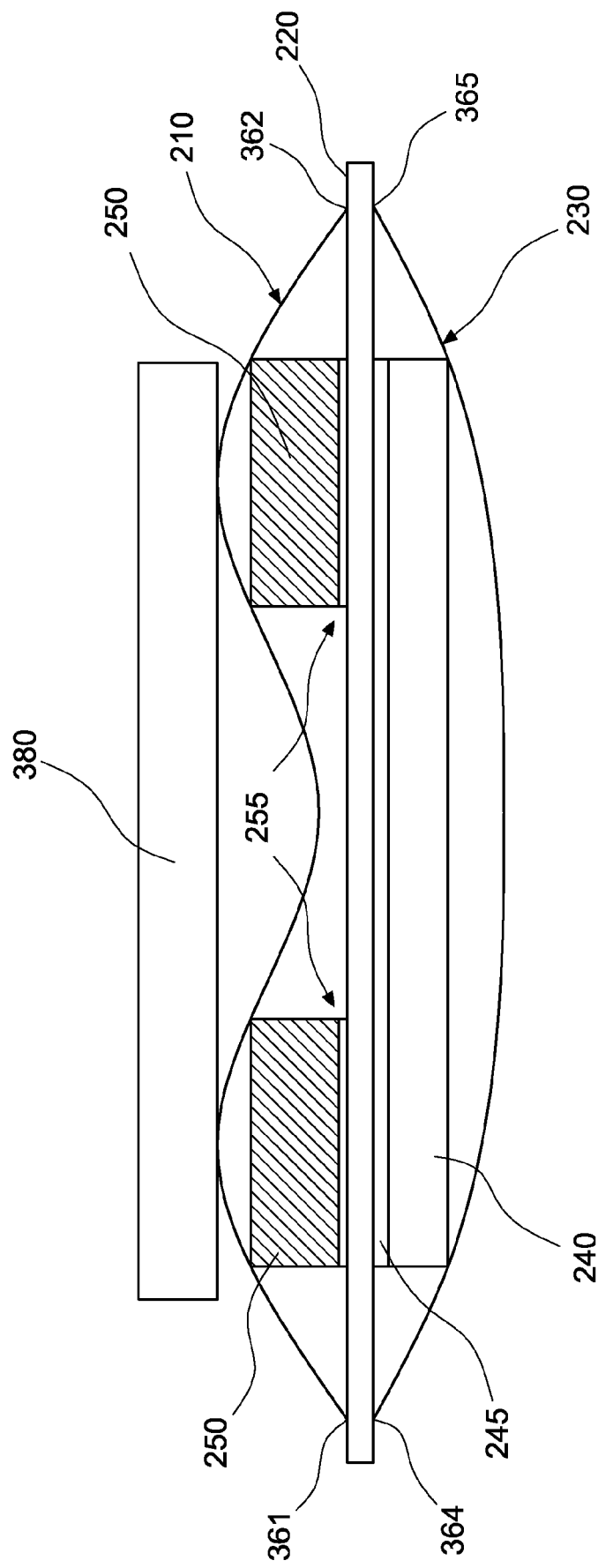
FIG. 11 is a schematic diagram showing an alternative embodiment of the electricity generating apparatus.

In alternative embodiments the outer elongate members need not be curved in a convex shape as in FIG. 3. FIG. 11 shows an alternative arrangement in which the first and third elongate members have a non regular curve. The important feature, in common with the embodiment of FIG. 3, is that the first elongate member joins the second elongate member at first 361 and second 362 points which are spaced apart. In between the first and second points 361, 362 there are one or more cavities between the inner surface of the first elongate member and the opposing first surface of the second elongate member. These cavities are preferably partially, or fully, filled with spacers for contacting the piezoelectric element or elements. As in the other embodiments, the second elongate member may comprise one or more piezoelectric elements or have one or more piezoelectric elements mounted thereon. The third elongate member has a similar arrangement and joins the second elongate member at third 364 and fourth 365 points, which are spaced apart.

In the example shown in FIG. 11 the first elongate element has a double hump type shape with two maxima. The arrangement preferably has a member 380 for contacting and transmitting force to the two maxima. This ensures that uniform pressure is applied to the first elongate member.

FIG. 4 shows the apparatus in operation, when an external force is being applied to it. A force 400, 410 is applied pushing the first member towards the second member and pushing the third member towards the second member. In other words the first and third elongate members are pushed together. The force may be due to application of pressure by a person walking, running or jumping, for example. The person's foot may apply the pressure via the footwear or floor as shown in FIG. 1 or 2.

The force 400, 410 causes the first and third elongate members to flatten slightly and move outwards which applies a stretching force to the second elongate member as shown in FIG. 4. The stretching force is applied via the joins 261, 262 between the first elongate member and the second elongate member and the joins 264, 265 between the third elongate member and the second elongate member. As the second elongate member is stretched, the piezoelectric elements 255, 245 are stretched. This stretching takes the form of longitudinal deformation as shown in FIG. 7(b). The stretching of the piezoelectric material generates electricity, which may be tapped by electrical lines (e.g. wires) and fed to an energy storage device or an electrically powered device.

Figure 6:
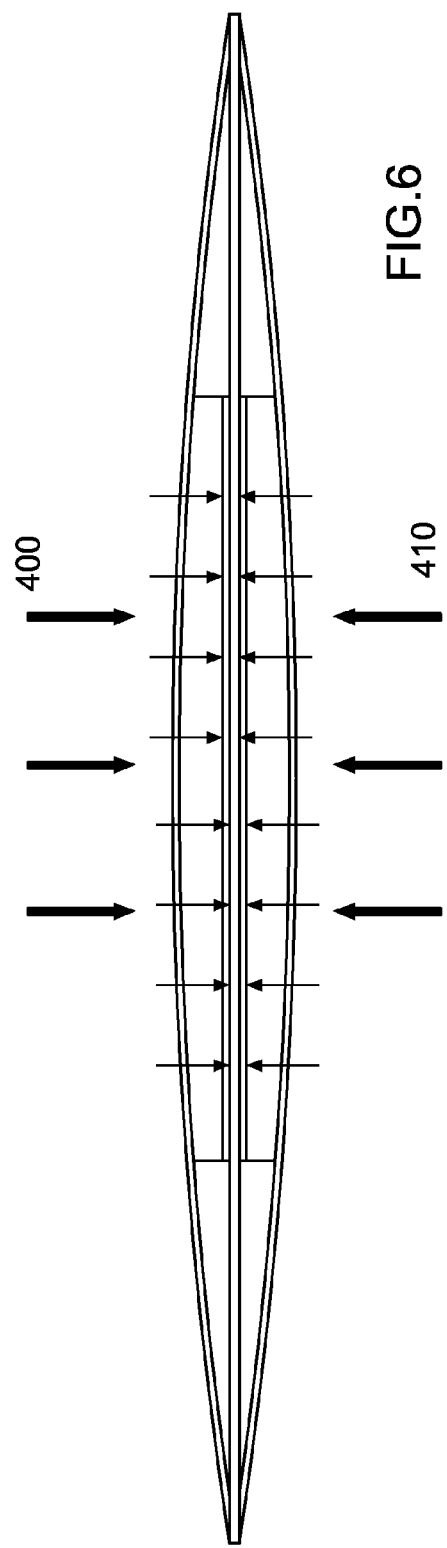
FIG. 6 illustrates how the apparatus of FIG. 3 applies a compressive force to the piezoelectric material.
Figure 7:
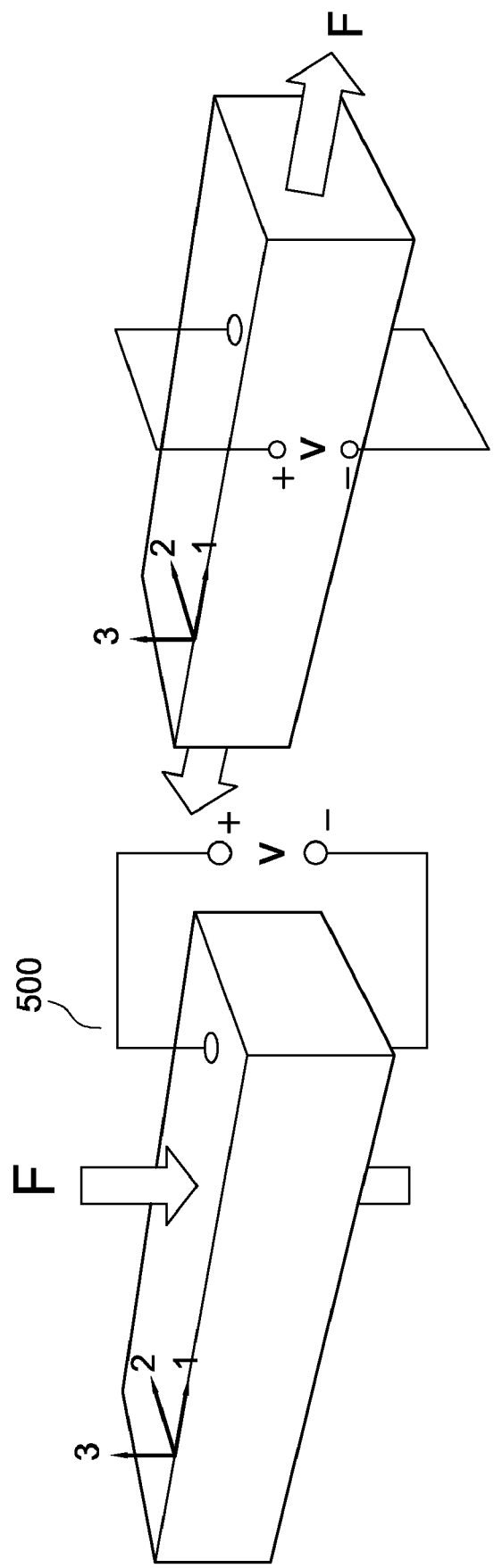
FIG. 7(a) illustrates a piezoelectric element being compressed.
FIG. 7(b) illustrates a piezoelectric element being stretched.

In addition to stretching, the force 400, 410 applied to the apparatus also causes a compressive force to be transmitted to the piezoelectric element or elements. See FIG. 6. The force is transmitted through the spacers 250, 240 as a compressive force to the respective piezoelectric elements 255, 245. This causes compression and transverse deformation of the piezoelectric elements as shown in FIG. 7(a). This compression generates electricity which may be tapped as described above. Transverse deformation of the piezoelectric element means compression along axis 3 and/or expansion along axis 2 in FIG. 7; basically deformation in the direction perpendicular to the longitudinal axis of the elongate member.

FIG. 7(a) shows a compressive force applied to a piezoelectric element. Deformation of the piezoelectric element, in response to the compressive force, generates electricity which may be tapped by wires 500. FIG. 7(b) shows a stretching force applied to a piezoelectric element. Deformation of the piezoelectric element, in response to the stretching force, generates electricity which may be tapped by wires 500.

After application of force 400, 410 to the apparatus, the stretching force is usually transmitted to the piezoelectric element first, followed by the compressive force later. This is due to the construction of the apparatus as shown in FIG. 3. The point at which the compressive force kicks in will depend upon the height of the spacers, the height of the gap between first and second elongate members and the properties of the spacer material.

Figure 8:
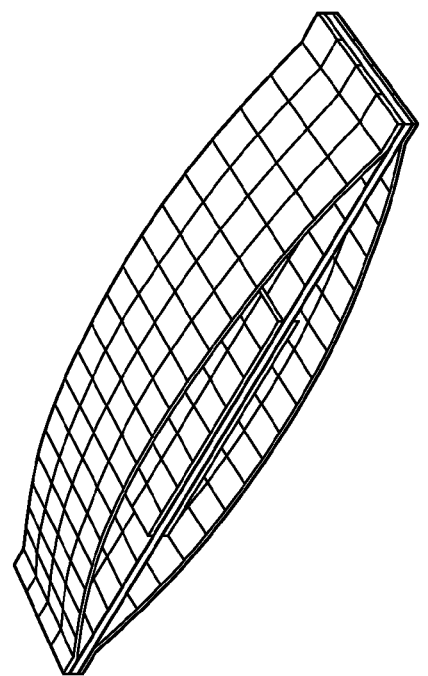
FIG. 8(a) illustrates a dual-mode apparatus for generating electricity.
FIG. 8(b) illustrates a stretching mode apparatus for generating electricity.
FIG. 8(c) illustrates a compression mode apparatus for generating electricity having a small gap between the elongate members.
FIG. 8(d) illustrates a compression mode apparatus for generating electricity having a large gap between the elongate members.
Figure 8:
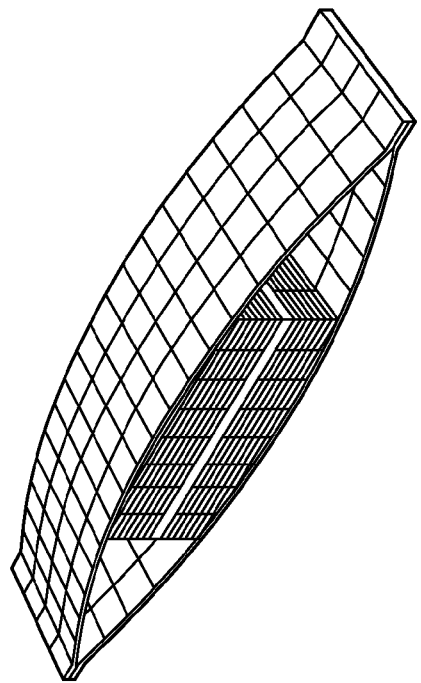
Figure 8:
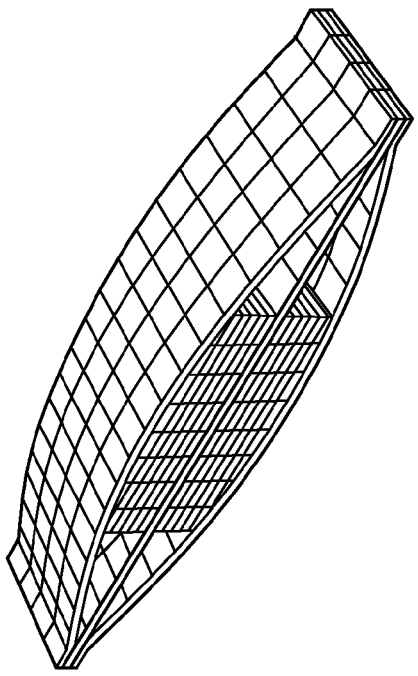
Figure 8:
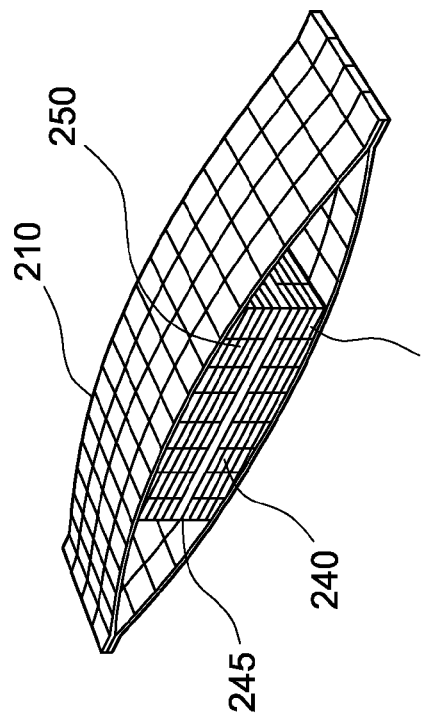
Figure 9:
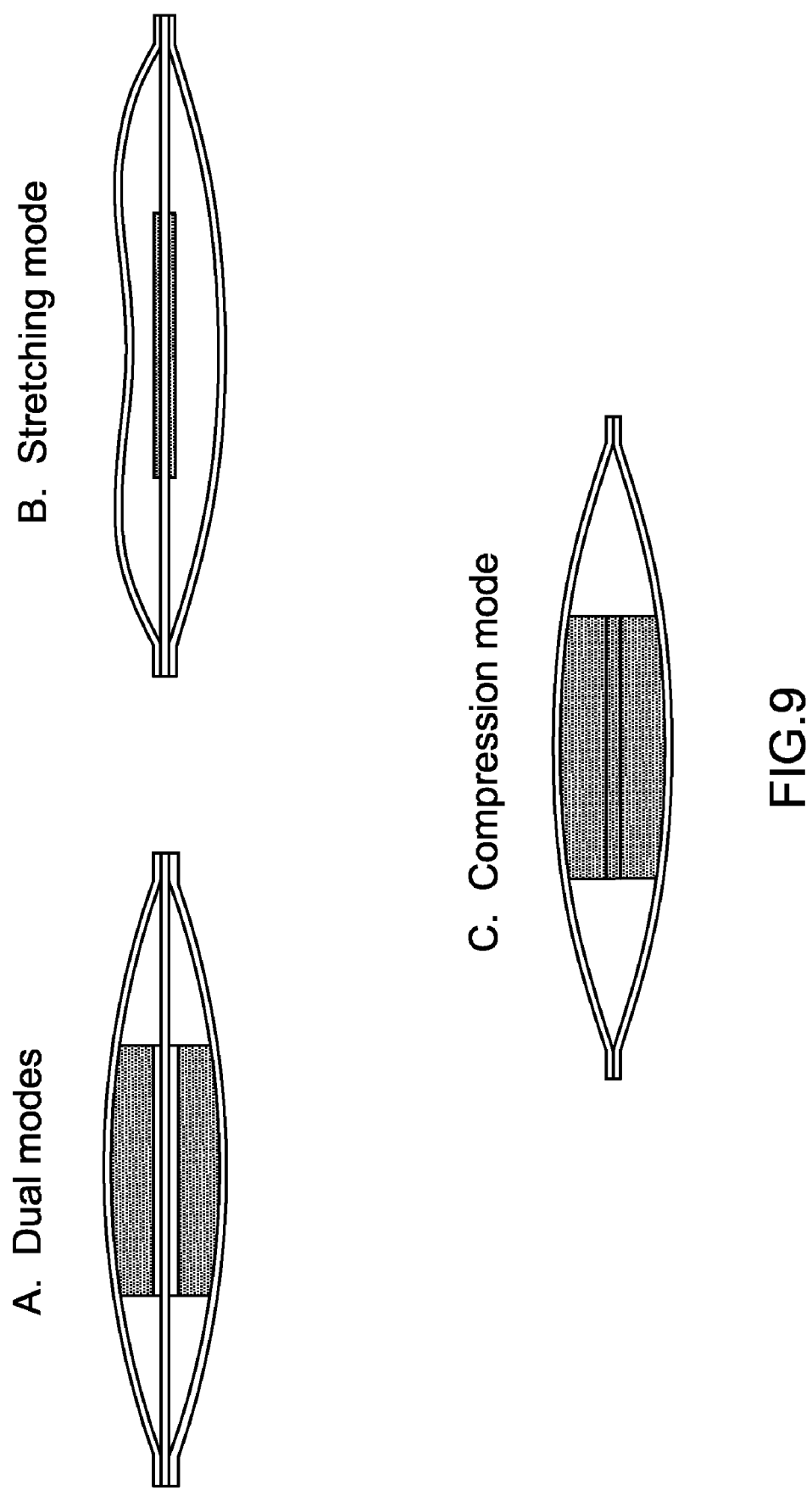
FIG. 9(a) is a cross section of a dual mode apparatus for generating electricity.
FIG. 9(b) is a cross section of a stretching mode apparatus for generating electricity.
FIG. 9(c) is a cross section of a compression mode apparatus for generating electricity.

FIGS. 8(a) to 8(d) show various different designs of apparatus for generating electricity. FIG. 8(a) is a three dimensional view of the design, the same as that discussed above with reference to FIGS. 3-6. It is shown in cross-section in FIG. 9(a).

In an alternative embodiment, shown in FIG. 8(b), the apparatus operates in stretching mode only. There are no spacers to transmit a compressive force to the piezoelectric elements. Therefore only a stretching force is applied to the piezoelectric elements. Unless, that is, the first or third member is deformed by such an extent that it actually touches the piezoelectric element or the second elongate member. The apparatus is shown in cross section in FIG. 9(b).

In the embodiment shown in FIG. 8(c), the apparatus operates in compressive mode only. A piezoelectric element 245 is placed between two spacers 240, 250. These are sandwiched between a first elongate member 210 and a second elongate member 330. Preferably both the first and second elongate members 210, 330 are curved. As there is no linear elongate member in the middle, there is no way of transmitting a stretching force to the piezoelectric element. Therefore only a compressive force is applied to the piezoelectric element via the spacers. A cross-sectional view is provided in FIG. 9(c). In an alternative arrangement, the second elongate element 330 to be substantially linear. However, that is not the preferred arrangement. Optionally one of the first and second spacers 240, 250 could be removed.

The apparatus shown in FIG. 8(d) is similar to FIG. 8(c), differing only in that the transverse gap (along the second axis 2) between the first and second elongate members is larger. The height of the spacers 240, 250 is also larger than in FIG. 8(c).

It is preferred that the stiffness of the outer elongate members is similar or substantially the same. (The outer elongate members are the first and third elongate members in FIGS. 8(a) and 8(b), or the first and second elongate members in FIGS. 8(c) and 8(d)). It is preferred that the stiffness of the inner elongate member (the second elongate member in FIGS. 8(a) and 8(b)) is less than the stiffness of the outer elongate members. When the inner elongate member has a lower stiffness than the outer elongate members, this has a tendency to increase the stretching force that is applied to the second elongate member and the piezoelectric elements.

Various materials will be suitable for making the apparatus and will be apparent to a person skilled in the art. Preferably the spacers are made from a resilient material which is able to absorb shocks. In one preferred embodiment, the elongate members are made of copper, the spacers are vinyl or PVC with a low modulus of elasticity and the piezoelectric material is PZT5H.

Figure 10:
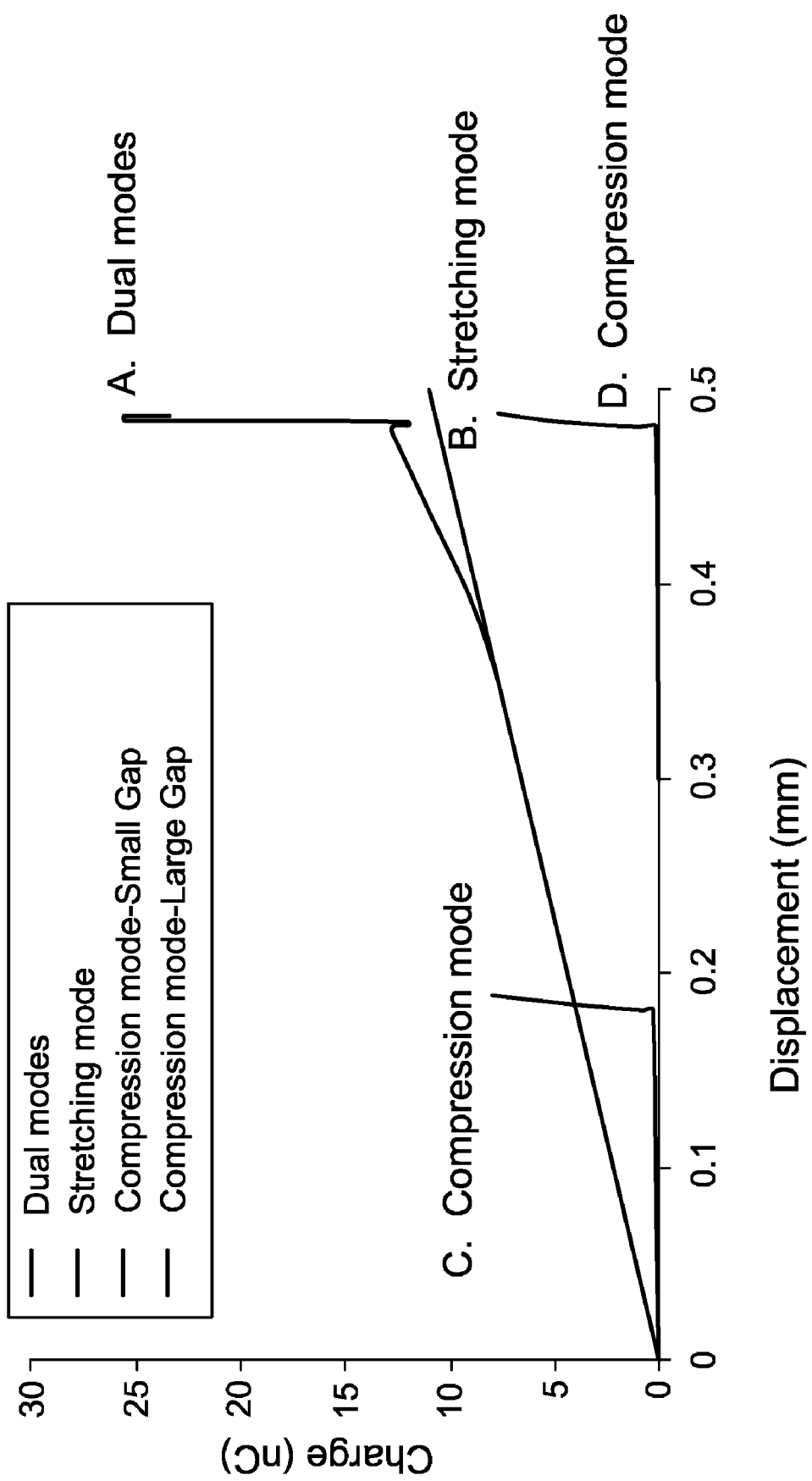
FIG. 10 is a graph illustrating the charge generated against displacement for the apparatus of FIGS. 8(a)-8(d)

The various apparatus shown in FIGS. 8(a) to (d) were tested. The results are shown in the graph of FIG. 10, which shows the charge produced against transverse displacement of the outer elongate members, for each design.

It can be seen that while the 'compression mode' apparatus of FIGS. 8(c) and 8(d) have different sizes of gap between their outer elongate members, this did not make any difference to the amount of charge produced. However, the greater the gap the larger the displacement required before an electric charge was produced.

The charge produced by stretching (as shown by the line representing the 'stretching mode' apparatus of FIG. 8(b)) increased linearly with displacement of the outer elongate members. The x-axis of the graph represents transverse displacement along axis 2 as the first member is pushed towards the second member.

The dual mode apparatus of FIG. 8(a), with both stretching and compression of the piezoelectric material, provided the best performance. The charge produced appeared to be greater than that from stretching and compression alone. The graph has an increased gradient between approximately 0.38 mm and 0.48 mm, indicating a contribution to the electric charge from both stretching and compression in that region.

Various embodiments of the present invention have been described above by way of example. However, modifications and variations to the described embodiments could be made without departing from the spirit and scope of the invention as defined in the claims.

The invention claimed is:

1. An apparatus for generating electricity comprising a first elongate member and a second elongate member, the first and second elongate members being joined together at first and second points which are spaced apart from each other, the second elongate member comprising a piezoelectric element or having a piezoelectric element mounted thereon; whereby when pressure is applied to the first elongate member the first elongate member applies a stretching force to the second elongate member via said first and second points, said stretching force pulling said first and second points in opposite directions thereby applying a stretching force to the piezoelectric element and wherein the apparatus further comprises at least one spacer between the first elongate member and the piezoelectric element, said at least one spacer being arranged for contacting the piezoelectric element between the first and second points; whereby when sufficient pressure is applied to the first elongate member the at least one spacer transmits a compressive force to the piezoelectric element.

2. The apparatus of claim 1 wherein the apparatus is arranged to apply the stretching force and the compressive force simultaneously to the piezoelectric element once the first elongate member has been deformed by a predetermined amount.

3. The apparatus of claim 1 wherein the first elongate member is stiffer than the second elongate member.

4. The apparatus of claim 1 wherein a third elongate member is provided on an opposite side of the second elongate member to the first elongate member; the third elongate member being joined to the second elongate member at third and fourth points which are spaced apart from each other.

5. The apparatus of claim 4 wherein the second elongate member has a first face facing the first elongate member and a second face facing the third elongate member; said first and second faces being at least partially coated with piezoelectric material.

6. The apparatus of claim 1 wherein the first elongate member is curved or non-linear.

7. The apparatus of claim 1 wherein the second elongate member is linear and non-curved.

8. The apparatus of claim 1 wherein the piezoelectric element is not curved.

9. The apparatus of claim 1 wherein the apparatus is designed for actuation by movement of the human body.

10. A section of floor having the electricity generating apparatus of claim 1 beneath it, the electricity generating apparatus being actuatable to generate electricity by people running, walking or moving over the floor.

11. Footwear comprising the electricity generating apparatus of claim 1.

12. The footwear of claim 11 comprising a ground contacting surface and a footbed surface, the electricity generating apparatus being provided between said ground contacting surface and said footbed surface.

13. An apparatus for generating electricity comprising first, second and third elongate members; wherein said first and third elongate members oppose each other and the second elongate member is provided in between said first and third elongate members; the first elongate member being connected to the second elongate member at first and second points which are spaced apart from each other, said second elongate member comprising one or more piezoelectric elements or having one or more piezoelectric elements mounted thereon; said apparatus being arranged such that when pressure is applied to push said first elongate member towards said third elongate member, the first elongate member applies a stretching force to the second elongate member via said first and second points, said stretching force pulling said first and second points in opposite directions thereby applying a stretching force to the piezoelectric element; and wherein the apparatus further comprises at least one spacer between the first elongate member and the piezoelectric element, said at least one spacer being arranged for contacting at least one of said one or more piezoelectric elements between the first and second points; whereby when sufficient pressure is applied to the first elongate member, the at least one spacer transmits a compressive force to said at least one of said one or more piezoelectric elements.

14. The apparatus of claim 13 wherein said apparatus is arranged to simultaneously apply both a compressive force and a stretching force to said at least one of said one or more piezoelectric elements.

15. The apparatus of claim 13 wherein said first and third elongate members are curved.

16. The apparatus of claim 1 wherein the at least one spacer fills all or a substantial part of the space between the first elongate member and the piezoelectric element.

17. The apparatus of claim 1 wherein the at least one spacer significantly limits the extent of deformation of the first elongate member in between the first and second points when pressure is applied to the first elongate member.

18. The apparatus of claim 1 wherein the second elongate member extends along a first axis and wherein said stretching force is a substantially linear force along said first axis.

19. The apparatus of claim 13 wherein the at least one spacer fills all or a substantial part of the space between the first elongate member and the one or more piezoelectric elements.

20. The apparatus of claim 13 wherein the at least one spacer significantly limits the extent of deformation of the first elongate member in between the first and second points when pressure is applied to the first elongate member.

21. The apparatus of claim 13 wherein the second elongate member extends along a first axis and wherein said stretching force is a substantially linear force along said first axis.

* * * * *